(12) United States Patent
Wallaschek et al.

(10) Patent No.: US 9,373,774 B2
(45) Date of Patent: Jun. 21, 2016

(54) PIEZOACTUATOR AND A METHOD FOR PRODUCING SUCH A PIEZOACTUATOR

(75) Inventors: Joerg Wallaschek, Paderborn (DE); Sebastian Mojrzisch, Hannover (DE); Jan Bremer, Hemmingen (DE)

(73) Assignee: GOTTFRIED WILHELM LEIBNIZ UNIVERSITAET HANNOVER, Hannover (DE)

(*) Notice: Subject to any disclaimer, the term of this patent is extended or adjusted under 35 U.S.C. 154(b) by 612 days.

(21) Appl. No.: 13/988,530

(22) PCT Filed: Nov. 21, 2011

(86) PCT No.: PCT/DE2011/075280
§ 371 (c)(1),
(2), (4) Date: May 21, 2013

(87) PCT Pub. No.: WO2012/069047
PCT Pub. Date: May 31, 2012

(65) Prior Publication Data
US 2013/0241354 A1  Sep. 19, 2013

(30) Foreign Application Priority Data

Nov. 23, 2010 (DE) .................. 10 2010 060 736

(51) Int. Cl.
*H01L 41/08* (2006.01)
*H01L 41/053* (2006.01)
*H01L 41/25* (2013.01)

(52) U.S. Cl.
CPC .......... *H01L 41/053* (2013.01); *H01L 41/0536* (2013.01); *H01L 41/25* (2013.01); *Y10T 29/42* (2015.01)

(58) Field of Classification Search
USPC .................................................. 310/311, 328
See application file for complete search history.

(56) References Cited

U.S. PATENT DOCUMENTS

| 3,281,726 A | 10/1966 | Schafft |
| 6,172,445 B1 | 1/2001 | Heinz et al. |
| 6,274,967 B1 | 8/2001 | Zumstrull et al. |
| 2004/0140737 A1 | 7/2004 | Barillot et al. |

FOREIGN PATENT DOCUMENTS

| DE | 38 05 121 A1 | 8/1989 |
| DE | 196 50 900 A1 | 6/1998 |
| DE | 196 53 555 A1 | 6/1998 |
| DE | 199 30 585 A1 | 2/2000 |
| DE | 199 28 185 A1 | 1/2001 |
| DE | 100 26 634 A1 | 1/2002 |
| DE | 101 39 871 A1 | 2/2003 |
| DE | 10 2005 028 970 A1 | 12/2006 |
| DE | 10 2006 032 995 A1 | 1/2008 |
| DE | 10 2004 005 943 B4 | 9/2009 |

*Primary Examiner* — Thomas Dougherty
(74) *Attorney, Agent, or Firm* — Leydig, Voit & Mayer Ltd.

(57) ABSTRACT

A piezo actuator includes an actuator body with a plurality of piezo elements and a tensioning device loading the actuator body with a bias. The tensioning device includes a traction device mounted as a biased winding on the actuator body in a plurality of turns around the actuator body. The traction device is at least one of resilient or flexible.

17 Claims, 4 Drawing Sheets

PIEZOACTUATOR AND A METHOD FOR PRODUCING SUCH A PIEZOACTUATOR

CROSS REFERENCE TO RELATED APPLICATIONS

This application is a U.S. National Phase application under 35 U.S.C. §371 of International Application No. PCT/DE2011/075280, filed on Nov. 21, 2011, and claims benefit to German Patent Application No. DE 10 2010 060 736.3, filed on Nov. 23, 2010. The International Application was published in German on May 31, 2012 as WO 2012/069047 A1 under PCT Article 21 (2).

FIELD

The invention relates to a piezo actuator comprising an actuator body comprising a plurality of piezo elements, the actuator body being loaded with a bias via a tensioning means. The invention further relates to a method for producing such a piezo actuator.

BACKGROUND

Such a piezo actuator, also referred to as a piezoelectric actuator, is usually constructed from a plurality of piezo elements which are arranged to form a stack-shaped actuator body. Each piezo element consists of a piezoceramic layer which is provided with a metal electrode on either side. When a voltage is applied to these electrodes, the piezoceramic layer responds with a lattice distortion. As a result, the piezo element, and thus the actuator body, expands and contracts in a direction which is determined by the arrangement of the piezoceramic layer and the electrodes of a piezo element. Depending on a degree of expansion and contraction, a useful change in a dimension of a stack-shaped actuator body is produced.

When a voltage of suitable polarity is applied to a piezoceramic disc, the layer thickness thereof increases slightly. In order to achieve adjustment distances which are useful in practice, such discs are stacked and thus operated mechanically in series. The maximum adjustment distance is proportional to the overall length of the stack forming the actuator body, and the load capacity is approximately proportional to the cross-section of said stack.

The actuator body is often arranged in a steel housing so as to obtain a mechanical bias for achieving relatively high tensile forces. In principle, ceramic actuator bodies should be exposed to no or only low tensile forces, and specifically at most 5% of the compressive load capacity. The most common measure for increasing the tensile load capacity of the system is therefore that of providing a piezo actuator with a mechanical bias.

When using piezo actuators as power generators, the useful force depends, as with other actuators, on the rigidity of the fixing. For the maximum drive voltage and an infinitely rigid clamping or fixing of the piezo actuator, the maximum force which can be produced is what is known as a blocking force. It is the force required to push a completely extended piezo actuator back into its starting position.

In addition, uses for a piezo actuator as a piezo injector are also known. In a piezo injector, the piezo actuator is connected to a nozzle needle such that a nozzle opening is freed by applying a voltage to the piezo elements.

U.S. Pat. No. 6,274,967 B1 discloses a piezo actuator in multilayer construction which is provided with a biasing device for introducing force into the piezoelectric layers. By means of the biasing device, a uniaxial compressive stress is applied to the piezoelectric layers in the stack direction of the piezo actuator.

DE 196 50 900 A1 relates to a piezo actuator which is provided for example for actuating injection valves on internal combustion engines in motor vehicles and is protected from tensile stresses in that resilient biasing elements are provided for the piezoelectric body of the piezo actuator and place the piezoelectric body under compressive bias. For this purpose, the piezoelectric body has a resilient chucking means which braces the end faces against one another under compressive bias, in that for example coupling elements or end plates are interconnected by resilient tensioning bands made of round or flat material or via a tubular bellows formed in the manner of a tension spring. For example, a spring sleeve having a substantially cylindrical shape and a lower region which undulates in a bellows-like manner is used for this purpose, the undulations being under high tensile stress such that the piezoelectric body is subjected to a corresponding compressive bias.

DE 10 2005 028 970 A1 relates to a piezo actuator which, when a voltage is applied, exhibits a particular expansion response depending on this voltage. In order to achieve an increased stroke response, the piezo actuator has at least one piezoelectric layer having at least one arch, which is arranged between two opposing electrode layers for producing an electric field in the piezoelectric layer, and a biasing device, by means of which a mechanical tension can be set in the piezoelectric layer via the at least one arch, such that the mechanical tension promotes an expansion response on the part of the piezo actuator when an electric field is produced in the biased piezoelectric layer.

The piezo actuator described in DE 199 28 185 A1 advantageously comprises at least one piezo element which is capable of applying a tensile or compressive force to an actuating element. The piezo element is held between a base plate and a spring plate which also rests against a housing via a biasing spring and guides the actuating element. In another embodiment, two piezo elements are arranged symmetrically about a tension rod which represents the actuating element and surrounded by an intermediate layer in the housing of the piezo actuator. In this case, the piezo elements are held between a support plate connected to the tension rod and a fixing edge in the housing. The support plate rests against the housing via a spring for biasing.

DE 196 53 555 A1 discloses a piezo injector in which the piezo elements are biased by means of a bellows towards the foot part of the piezo actuator and are guided laterally in order to achieve a compact and short design. A laterally spring-loaded and particularly low-friction mounting of the piezo elements is achieved by means of the bellows. The bellows is made of steel or plastics material having a corresponding resilience and tightness.

DE 101 39 871 A1 discloses a piezo injector comprising a piezo actuator which acts on a valve member via a hydraulic pressure intensifier, in which the piezo elements of the piezo actuator are arranged in a sleeve provided with a corrugated bellows. The piezo elements are biased towards the foot part of the piezo actuator by means of a plate spring which rests against the head part of the piezo actuator and is supported on a guide body.

DE 100 26 635 A1 also shows a piezoelectric actuator. In the piezoelectric actuator the piezo elements are arranged one on top of the other in a stack direction to form a monolithic actuator body. A plurality of electrode layers, which are known as internal electrodes, and a plurality of piezoelectric layers made of a piezoceramic material (piezoceramic layers)

are stacked alternately one on top of the other and sintered jointly to the monolithic actuator body.

DE 199 30 585 A1 discloses a piezo actuator which comprises a contact lug for electrically contacting an electrode of an actuator body. Owing to expansion and contraction of the actuator body, a mechanical stress occurs in the contact lug, which stress is minimised in that the contact seat comprises a deformation material in the form of a wire mesh for adapting the dimension to a degree of the expansion and contraction. The underlying idea is to reduce this mechanical stress in the contact lug.

An electrical component having a tension-relieved and compression-relieved soldered joint can be found in DE 38 05 121 A1.

DE 10 2004 005 943 B4 relates to a piezo actuator which comprises at least two electrode layers arranged one on top of the other and at least one piezoelectric layer arranged between the electrode layers, as well as at least one electrically conductive wire. The wire is designed such that no stress peaks, which can cause the wire to break, occur in the wire as a result of the mechanical load, in that the stresses occurring in the wire over the length of the wire are matched to one another. For example, a tensile stress can be converted into a shear stress owing to the form of the wire. As a result, a more homogeneous, approximately uniform tensile stress occurs along the wire. In one configuration the wire has a mechanical bias, for example a tensile stress, which counteracts the mechanical stress occurring during operation of the electrical component.

DE 10 2006 032 995 A1 relates to an electromechanical motor, in particular a piezoelectric ring motor, in which biasing elements having increased carrying force are used instead of the hollow springs usually used in such ring motors. The biasing elements extend parallel to the effective direction of a piezoelectric multilayer actuator. For example, the biasing element is formed by a spring band or a spring wire.

A drawback of the piezo actuators known from the prior art is the additional space requirement associated with the tensioning means, in particular with the support frame construction required in this regard as an abutment for the tensioning element. In addition, the tensioning means and the support frame increase the complexity of production, and this leads to increased production costs overall. Moreover, a high rigidity of the tensioning element leads to an undesirable stroke loss.

SUMMARY

In an embodiment, the present invention provides a piezo actuator includes an actuator body with a plurality of piezo elements and a tensioning device loading the actuator body with a bias. The tensioning device includes a traction device mounted as a biased winding on the actuator body in a plurality of turns around the actuator body. The traction device is at least one of resilient or flexible.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
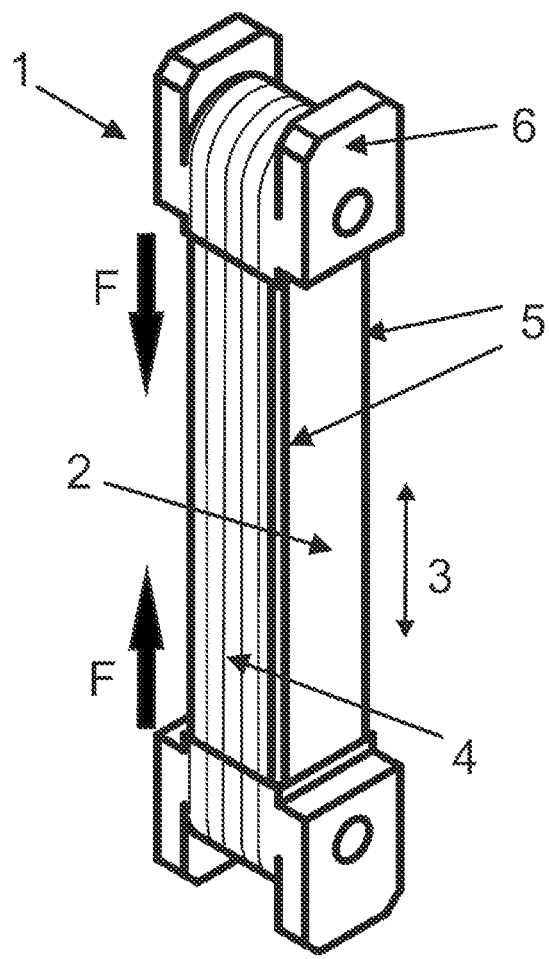
FIG. 1 is a perspective view of a piezo actuator according to the invention.

An aspect of the invention is to reduce substantially the space requirement and at the same time also the production costs for a piezo actuator of the type mentioned at the outset. Another aspect of the invention is to provide a method for producing such a piezo actuator.

According to the invention, a piezo actuator is thus provided in which the tensioning means has a resilient and/or flexible traction means which is wound with a bias in a plurality of turns around the actuator body. As a result, the desired bias of the actuator body for preventing tensile forces acting on the actuator body is achieved in a surprisingly simple manner without an additional auxiliary frame simply by winding a plurality of turns on the actuator body, in that during the winding process a desired bias of the traction means is produced and transferred to the actuator body. According to the invention, an extremely compact design of the piezo actuator is thus achieved because the traction means has a small cross-sectional area and can be guided directly along the actuator body. The strong extension of the traction means results in low rigidity and thus in a low stroke loss.

The actuator body could have an opening or be designed as a hollow body, for example as a hollow cylinder, such that the traction means can, upon each turn, be guided both through the interior and on the outside along the outer face, so as to be able reliably to rule out slipping or sliding. Inward-facing projections, for example, could of course also be provided in the cavity in order to be able to guide the traction means exclusively inside the cavity by winding around the projections. However, a configuration of the invention in which the traction means is mounted on opposing faces, in particular longitudinal sides of the actuator body, is particularly advantageous. As a result, the production of the winding is simplified substantially in that the actuator body is rotated about its transverse axis and the biased traction means can be mounted over the narrow sides of the actuator body, parallel to its longitudinal axis.

Of course, the winding is not limited to two mutually opposing faces. Rather, separate windings can be mounted on a plurality of faces which oppose one another in pairs. Equally, a single traction means can be wound initially on a first pair of opposing faces and subsequently or alternately on at least one further pair of opposing faces, such that the complexity of production can be reduced further.

A particularly advantageous embodiment of the invention is achieved in that the traction means is mounted, in relation to the face to be wound on of the piezo element, via turns in a common plane, side by side and without spacing, such that all turns assigned to a face selectively extend in the same plane parallel to this face. It is clear that a very compact design is achieved as a result. At the same time, the biasing force is distributed in a largely uniform manner over a plurality of adjacent individual turns which extend either directly adjacent to one another or with mutual spacing.

In another, likewise particularly expedient configuration of the present invention, the traction means extends, in relation to the face to be wound on of the piezo elements, as turns in a plurality of planes located one above the other. For this purpose, a strip-shaped traction means can also be used, for example, the width of which can correspond substantially to the width of the face to be wound on, and which is then mounted similarly to a spiral spring in a plurality of increasingly large turns in a plurality of parallel planes relative to the face, so as to apply the desired tensile force. Of course, mixed forms, in which the traction means extends both contiguously and also in an overlapping manner in a plurality of planes, are also possible.

The traction means can in principle be of any desired nature with low or high resilience and can be made of virtually any desired material. Particularly expedient is an embodiment of the invention in which the traction means is a wire, for example made of tungsten or steel, a cable, a strip, a chain or a cord having a round or rectangular cross-section, it also being possible to select different traction means for different purposes of use. In fact, in principle any material which is flexible and can thus be wound is suitable for the purposes of the invention, and therefore wovens, nets or films are also possible as traction means.

The traction means could for example be in the form of a wire provided with insulation, such that damage to one or more turns can be detected easily, for example in an automated manner, by a conductivity test. In addition, any metal wire known per se can be used. However, a modification of the invention in which the traction means consists of a plastics fibre, for example an aramid fibre or a high-strength polyethylene fibre, so as to reduce the production costs, is particularly simple. The plastics fibre can be selected according to the desired resilience of the bias which can be achieved via the tensioning means.

The traction means preferably consists of a shape memory alloy, the resilience of which is many times that of conventional metals. Owing to the fact that, as a result of its internal stress, the material returns to its original shape when unloaded, the achievable change in length of such shape memory alloys being in the range of up to 10% in the case of comparatively small forces, the stroke of the piezo actuator is increased by up to 20%. In particular, the maximum possible stroke is thus achieved, at least approximately. In contrast to other traction means, shape memory alloys do not lead to a noticeable reduction of the stroke, and therefore an expansion of the piezo actuator of 0.1% to 0.2% can be achieved. A suitable material is for example nickel-titanium, although in principle it is also possible to use shape memory polymers.

In another, likewise particularly expedient development of the invention, in which the piezo actuator has a plurality of shaped bodies for receiving the windings, which bodies rest against opposing faces of the actuator body, firstly a uniform introduction of force to the face by the shaped bodies loaded by the individual turns of the traction means is achieved, it being possible for the shaped body to have a shape, in particular a convex curvature, which corresponds to the deflection. Secondly, the shaped body prevents, for example via corresponding projections, lateral sliding of the traction means. For this purpose the shaped body can be designed as a cap which can be placed on the end face of the actuator body.

It is also particularly expedient for the shaped body to comprise at least one fixing element for the end regions of the traction means, so as to fix, via a single turn or a few turns, the opposing end regions of the traction means and thus simultaneously the shaped body to the actuator body, such that further aids for fixing the shaped body to the actuator body are not required and the traction means is fixed at the same time.

The second object, that of providing a method for producing a piezo actuator in which the actuator body is loaded, by means of a tensioning means, with a bias which counteracts the expansion of said actuator body during operation, is achieved according to the invention in that, as tensioning means, a plurality of turns of a flexible traction means is mounted as a resiliently biased winding on the actuator body. As a result, the bias is introduced into the traction means during the winding process in a simple manner and in such a way that it can be adjusted according to the intended purpose of use, and is thus transferred to the actuator body.

A configuration of the method in which a stress is introduced into the traction means when the actuator body is being wound on, in that the traction means is loaded with a biasing force and wound around the actuator body, is particularly promising. The biasing force required for this purpose is introduced for example by means of an electric motor which acts as a wire brake, is connected to a wheel, portions of which wheel are encircled by the traction means, and transfers to the traction means an adjustable biasing force counter to the winding direction of the wire on the basis of a control signal of a sensor which detects the stress of the traction means.

Of course, designs are also conceivable in which the piezo actuator has an effective direction which does not extend parallel to the longitudinal extension thereof. In practice, however, it is advantageous for the actuator body to be driven in rotation about an axis transverse to the main extension thereof in a mounting of a winding device, so as to wind on the faces of the actuator body which correspond to the main extension.

In another, likewise particularly promising configuration of the method, initially two shaped bodies are fixed temporarily in a seat with predetermined mutual spacing. A winding is then produced on the shaped bodies via a plurality of turns, and finally the spacing is increased against the elastic restoring force of the winding and the actuator body is inserted between the shaped bodies. As a result, a winding is thus initially produced without the actuator body and thus independently thereof in production, similarly to an air-core coil, such that the actuator body and the winding initially form independent components. These elements are connected by resilient stretching of the winding, in that the spacing between the shaped bodies, which can of course also be interconnected in one piece, is increased by means of a suitable tensioning device. In this state, the end face of the actuator body is inserted between the shaped bodies such that, after separation from the tensioning device, the applied biasing force acts on the actuator body. In this manner a biasing force required for the associated purpose of use can easily be provided by selection from available windings, so as to produce a modular construction.

FIG. 1 is a perspective view of a piezo actuator 1 according to the invention. The piezo actuator 1 has an actuator body 2 which is made up of a plurality of piezo elements. In order to avoid tensile stress on the actuator body 2 in the direction of its longitudinal extension 3, which stress is damaging during operation, the actuator body 2 is loaded with a bias F via a permanently active, resiliently biased traction means 4 made of a polyaramide fibre. For this purpose, the tensioning means 4 is mounted as a winding on the actuator body 2, in a plurality of turns around opposing faces 5, parallel to the longitudinal extension 3 of the actuator body 2, under tensile stress. It can be seen that the individual turns of the traction means 4, which adjoin one another directly without spacing, form a planar winding parallel to the face 5 to be wound on of the actuator body 2, such that not only a uniform introduction of force but also a very small space requirement is achieved. The turns do not rest directly against an end face of the actuator body 2.

Figure 2:
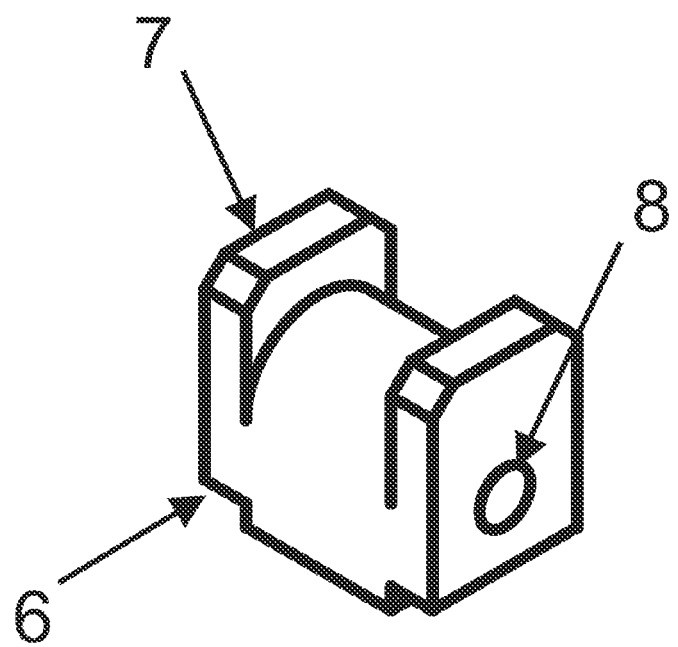
FIG. 2 is an enlarged view of a shaped body for receiving the winding of the piezo actuator shown in FIG. 1.

Rather, the actuator body 2 carries two shaped bodies 6 which rest against opposing faces of the actuator body 2 and can be seen in particular in an enlarged view in FIG. 2. The shaped bodies 6 are used to receive the windings, and the projections 7 of said shaped bodies prevent lateral sliding of the traction means 4. Each shaped body 6 is already provided with at least one recess 8 for fixing the piezo actuator 1 in its subsequent working position. A planar shape of the face facing the actuator body 2 makes it easier to fix the shaped body 6 to the end face of the actuator body 2, preferably with positive locking.

Figure 3:
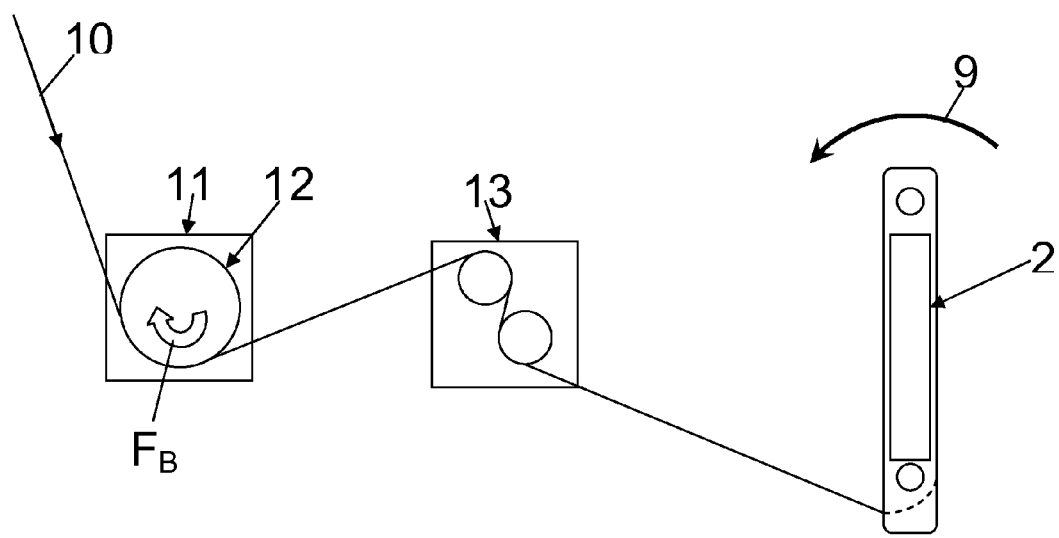
FIG. 3 shows an arrangement for producing a winding on the piezo actuator.

In addition, FIG. 3 shows an exemplary arrangement for producing the winding shown in FIG. 1 on the actuator body 2. In order to be able to introduce the required stress into the traction means, which extends in the insertion direction 10, when winding on the actuator body 2 in the winding direction 9, the traction means is wound onto the actuator body 2 against a braking force FB. The braking force FB is introduced by means of an electric motor 11 which is connected to a friction wheel 12, portions of which wheel are encircled by the traction means, and thus transfers to the traction means an adjustable torque counter to the winding direction 9 of the actuator body 2 on the basis of a control signal of a sensor 13 which continuously measures the stress of the traction means.

Figure 4:
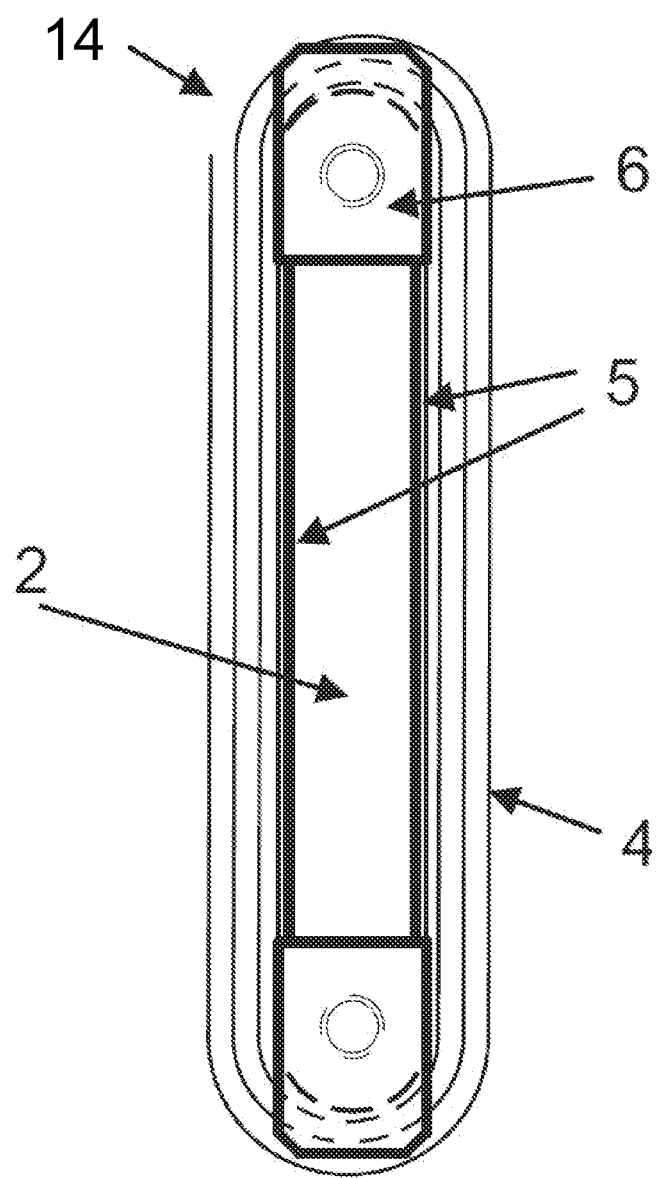
FIG. 4 is a side view of a further piezo actuator according to the invention.

FIG. 4 shows a further piezo actuator according to the invention, in which the traction means 4 is arranged, in relation to the face to be wound on of the piezo elements, as turns in a plurality of planes located one above the other on the actuator body 2. Because the traction means 4 is arranged as a planar winding in a plurality of planes parallel to the face 5 to be wound on of the actuator body 2, it is possible in particular also to use a strip-shaped traction means 4, the width of which corresponds substantially to the width of the face to be wound on.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B." Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise.

The invention claimed is:

1. A piezo actuator comprising:
an actuator body including a plurality of piezo elements;
a tensioning device loading the actuator body with a bias, the tensioning device including a traction device mounted as a biased winding on the actuator body in a plurality of turns around the actuator body, the traction device being at least one of resilient or flexible.

2. The piezo actuator recited in claim 1, wherein the actuator body includes opposing faces and the traction device is mounted on the opposing faces.

3. The piezo actuator recited in claim 2, wherein the traction device is mounted on the opposing faces parallel to a longitudinal extension of the actuator body.

4. The piezo actuator recited in claim 1, wherein the traction device, in relation to the faces of the actuator body on which the traction device is wound, is formed in a plurality of turns side by side in a common plane.

5. The piezo actuator recited in claim 1, wherein the traction device, in relation to the faces of the actuator body on which the traction device is wound, is formed in turns in a plurality of planes located one above the other.

6. The piezo actuator recited in claim 1, wherein the traction device includes at least one of a wire, a cable, a strip, a chain or a cord.

7. The piezo actuator recited in claim 1, wherein the traction device includes a round or polygonal cross-sectional shape.

8. The piezo actuator recited in claim 7, wherein the cross-sectional shape is circular.

9. The piezo actuator recited in claim 1, wherein a substantial portion of the traction device is formed by a plastics fiber.

10. The piezo actuator recited in claim 1, wherein the traction device includes a shape memory alloy.

11. The piezo actuator recited in claim 1, further comprising a plurality of shaped bodies disposed on opposing faces of the actuator body, the shaped bodies receiving windings of the traction device.

12. The piezo actuator recited in claim 11, wherein each shaped body includes at least one fixing element for an end region of the traction device.

13. A method of producing a piezo actuator, the method comprising:
providing an actuator body including a plurality of piezo elements;
loading the actuator body with a bias using a tensioning device so as to counteract an undesirable tensile force, the tensioning device including a plurality of turns of a flexible traction device mounted as a resiliently biased winding on the actuator body.

14. The method recited in claim 13, wherein the traction device includes a shape memory alloy.

15. The method recited in claim 14, wherein the traction device is wound onto the actuator body against a baking force so as to introduce a stress is into the traction device as it is would on the actuator body.

16. The method recited in claim 14, wherein the actuator body is driven in rotation about an axis transverse to a longitudinal extension of the actuator body in a mounting of a winding device.

17. The method recited in claim 14, further comprising, prior to winding the traction device on the actuator body, temporarily fixing two shaped bodies in a seat with predetermined mutual spacing, mounting the winding on the shaped bodies with a plurality of turns, increasing the spacing between the shaped bodies against an elastic restoring force of the winding, and inserting the actuator body between the shaped bodies.

\* \* \* \* \*